United States Patent
Horimai

(10) Patent No.: US 8,045,423 B2
(45) Date of Patent: Oct. 25, 2011

(54) SEARCH METHOD

(75) Inventor: Hideyoshi Horimai, Yokohama (JP)

(73) Assignee: Optware Corporation, Kanagawa (JP)

(*) Notice: Subject to any disclaimer, the term of this patent is extended or adjusted under 35 U.S.C. 154(b) by 662 days.

(21) Appl. No.: 11/991,569

(22) PCT Filed: Sep. 8, 2006

(86) PCT No.: PCT/JP2006/317812
§ 371 (c)(1),
(2), (4) Date: Mar. 6, 2008

(87) PCT Pub. No.: WO2007/029799
PCT Pub. Date: Mar. 15, 2007

(65) Prior Publication Data
US 2009/0040885 A1 Feb. 12, 2009

(30) Foreign Application Priority Data
Sep. 9, 2005 (JP) ................. 2005-261737

(51) Int. Cl.
*G11B 7/085* (2006.01)
(52) U.S. Cl. .................................. 369/30.03
(58) Field of Classification Search .......... None
See application file for complete search history.

(56) References Cited

U.S. PATENT DOCUMENTS

| | | | | |
|---|---|---|---|---|
| 2003/0063342 | A1* | 4/2003 | Horimai | 359/22 |
| 2004/0067419 | A1* | 4/2004 | Mizushima | 430/1 |
| 2007/0081439 | A1* | 4/2007 | Tsukagoshi et al. | 369/103 |
| 2007/0183008 | A1* | 8/2007 | Kogure et al. | 359/3 |

FOREIGN PATENT DOCUMENTS

| | | |
|---|---|---|
| JP | 10-124782 | 5/1998 |
| JP | 11-311938 | 11/1999 |
| JP | 2001-118252 | 4/2001 |
| JP | 2003-099952 | 4/2003 |

* cited by examiner

*Primary Examiner* — Joseph Feild
*Assistant Examiner* — Henok Heyi
(74) *Attorney, Agent, or Firm* — DLA Piper LLP (US)

(57) ABSTRACT

A search method of efficiently retrieving information is provided.

A search light 21 is generated from a search condition (S1). The search light is irradiated onto a hologram 104a recorded in a hologram recording layer 104 (S2). When the search light interferes with the hologram and a reproduction light is generated, address information of the hologram from which the reproduction light is generated is identified using an address light 23 that reads the address information. The identified address light is recorded (S3). When the search light does not generate the reproduction light from the hologram, the search light is irradiated onto another hologram 104b recorded in the hologram recording layer.

9 Claims, 8 Drawing Sheets

SEARCH METHOD

TECHNICAL FIELD

The present invention relates to a search method for information in a recording medium that has a hologram recording layer in which a plurality of holograms are recorded as information.

BACKGROUND ART

Holographic recording that records information in a recording medium using holography is generally performed by an information light that carries image information and a reference light being superimposed within the recording medium. An interference fringe pattern formed at this time is written in the recording medium. When the recorded information is reproduced, the reference light is irradiated onto the recording medium. Image information is reproduced by diffraction caused by the interference fringe pattern.

In recent years, in holographic recording, volume holography, particularly digital volume holography that has been developed for practical use to achieve ultra-high data density is receiving attention. The volume holography is a method in which interference fringes are three-dimensionally written through active use of a thickness direction of the recording medium. While using the same recording medium and recording method as the volume holography, the digital volume holography is a computer-oriented holographic recording method that limits the image information to be recorded to a binarized digital pattern. In the digital holography, even image information such as an analog illustration is digitalized and developed into two-dimensional digital pattern information. The two-dimensional digital pattern information is then recorded as the image information. During reproduction, the digital pattern information is read and decoded, thereby returning the digital pattern information to the original image information. The image information is then displayed. As a result, even when a signal-to-noise (SNS) ratio is somewhat poor during reproduction, the original information can be very accurately reproduced through differential detection and through binary data encoding and error correction.

An example of recording being performed in a hologram recording layer by volume holography is as follows. An information light carrying information to be recorded and a recording reference light are simultaneously irradiated from a transparent substrate side for a predetermined amount of time such that interference fringes in a thickness direction are formed within the hologram recording layer. An interference fringe pattern is three-dimensionally fixed within the hologram recording layer. As a result, the information is recorded as a three-dimensional hologram (Patent Literature 1 and Patent Literature 2).

Optical information recording methods include a method in which recording is performed with the information light and the recording reference light being disposed on optical axes of differing angles and a method in which recording is performed with the information light and the recording reference light being disposed on a same axis. The recording method in which the information light and the recording reference light are disposed on the same axis is receiving attention as a method suitable for volume holography, such as that described above (refer to, for example, Patent Literature 3).

Patent Literature 1: Japanese Patent Laid-open Publication No. Heisei 11-311938
Patent Literature 2: Japanese Patent Laid-open Publication No. 2003-99952
Patent Literature 3: Japanese Patent Laid-open Publication No. Heisei 10-124872

DISCLOSURE OF INVENTION

Problem to be Solved by the Invention

As described above, in holographic recording and reproduction, a large volume of information, such as image information and binary digital pattern information, is recorded in a single hologram. Moreover, a plurality of holograms are recorded in the recording medium. Therefore, an enormous amount of information is recorded in the recording medium.

Conventionally, a method of searching for a certain piece of information in a recording medium in which the enormous amount of information is recorded has not been proposed. Therefore, to search for a certain piece of information in the recording medium, a following operation is required to be repeatedly performed until a search subject is found. A reproduction reference light is irradiated onto each hologram. The image information, the binary digital pattern information, and the like are reproduced from each hologram. If the binary digital pattern information is reproduced, the binary digital pattern information is decoded and the recorded information is reproduced. Then, whether the reproduced information is the search subject is confirmed.

However, the image information and the binary digital pattern information generated as a result of the hologram being reproduced are formed by a large number of pixels. To detect the image information and the binary digital pattern information, light detectors, such as a charge-coupled device (CCD) sensor and a complimentary metal-oxide semiconductor (CMOS) sensor, corresponding to each pixel are required. Because a light intensity of each reproduced pixel is weak, time is required for a large number of light detectors to acquire the image information and the binary digital pattern information.

In this way, even reproduction of a single hologram from the recording medium requires time. Therefore, the above-described search method requires a very large amount of time and is inefficient also in terms of each hologram being required to be successively reproduced until the search subject is found.

An object of the present invention is to provide a search method that can efficiently search for information in a recording medium that has a hologram recording layer in which a plurality of holograms are recorded.

Means for Solving Problem

A search method of the present invention is a search method for a recording medium having a hologram recording layer in which a plurality of holograms are recorded and an address layer in which address information is recorded. In the search method, a search light is generated from a search condition. The search light is irradiated onto a hologram recorded in the hologram recording layer. When the search light interferes with the hologram and a reproduction light is generated, address information of the hologram from which the reproduction light is generated is identified using an address light that reads the address information. The identified address information is recorded. When the search light does not generate the reproduction light from the hologram, the search light is irradiated onto another hologram recorded in the hologram recording layer.

In addition, in the search method, even after the identified address information is recorded, the search light can be irradiated onto another hologram recorded in the hologram recording layer.

In addition, in the search method, preferably, an intensity of the generated reproduction light is detected, and the detected intensity of the reproduction light is recorded in association with the address information of the hologram from which the reproduction light is generated. In this case, address information with the highest reproduction light intensity can be outputted in a recognizable state. Alternatively, pieces of address information can be outputted in a recognizable state in order, from the address information with the highest reproduction light intensity.

In addition, in the search method, information related to the hologram from which the reproduction light is generated can be recorded in the recording medium. Moreover, an order in which the search light is irradiated onto the holograms can be controlled using the information related to the hologram from which the reproduction light is generated that is recorded in the recording medium.

In addition, in the search method, the hologram is interference fringes formed by interference between an information light carrying information and a recording reference light. The recording reference light can be spatially modulated by a spatial modulation pattern including keyword information related to the information carried by the information light. The search light can be spatially modulated by a spatial modulation pattern including keyword information of the search condition.

In addition, in the search method, the program is interference fringes formed by interference between an information light carrying image information and a recording reference light. The search method can be spatially modulated by the image information of the search condition.

Effect of the Invention

In the search method of the present invention, a search light is generated from a search condition. The search light is irradiated onto a hologram recorded in a hologram recording layer. When the search light interferes with the hologram and generates a reproduction light, address information of the hologram that has generated the reproduction light is identified through use of an address light that reads the address information. The identified address light is recorded. Therefore, a targeted piece of information can be efficiently retrieved.

BEST MODE(S) FOR CARRYING OUT THE INVENTION

An embodiment of the present invention will be described below with reference to FIG. 1 to FIG. 8.

Figure 1:
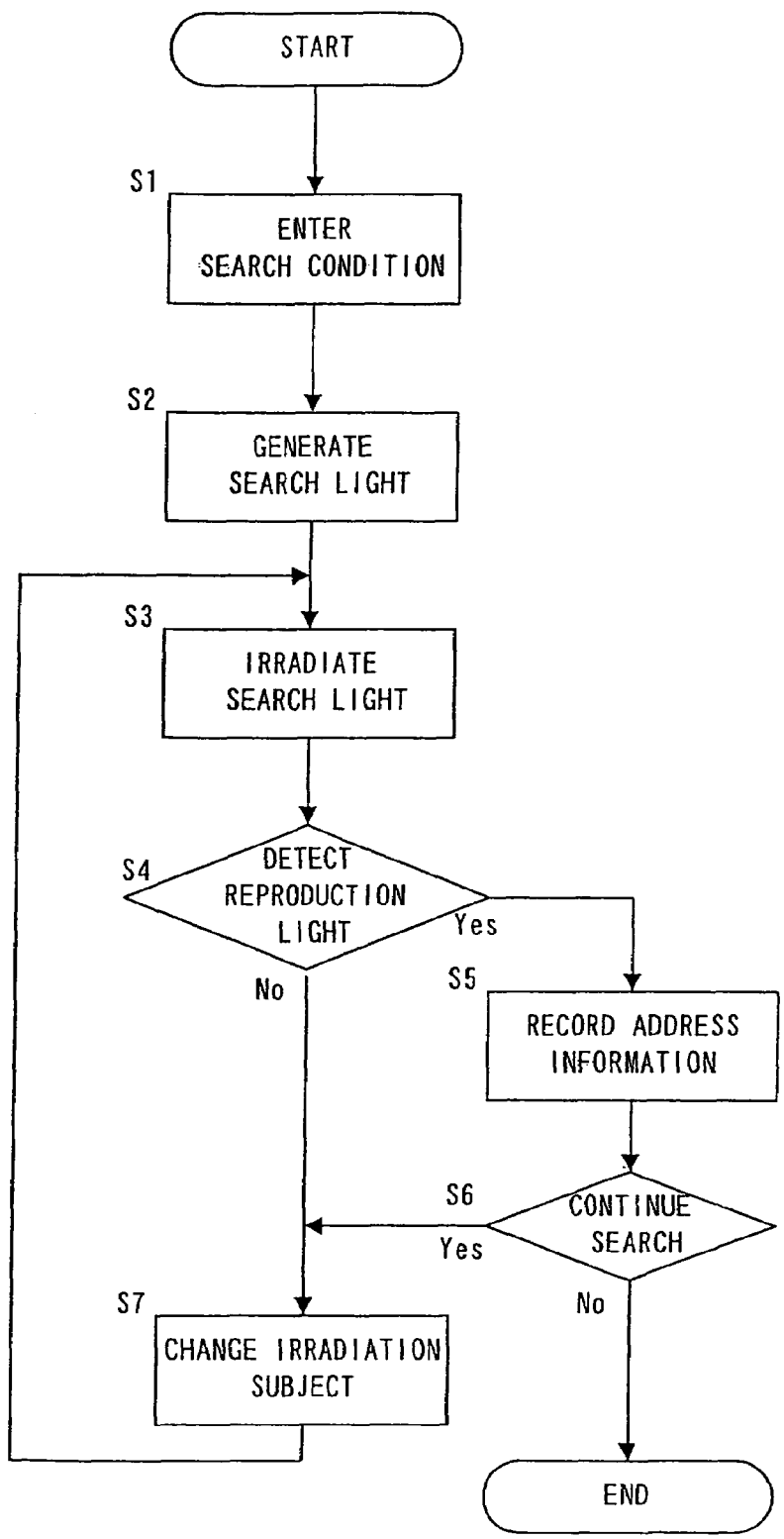
FIG. 1 is a flowchart of a search method of the present invention.
Figure 2:
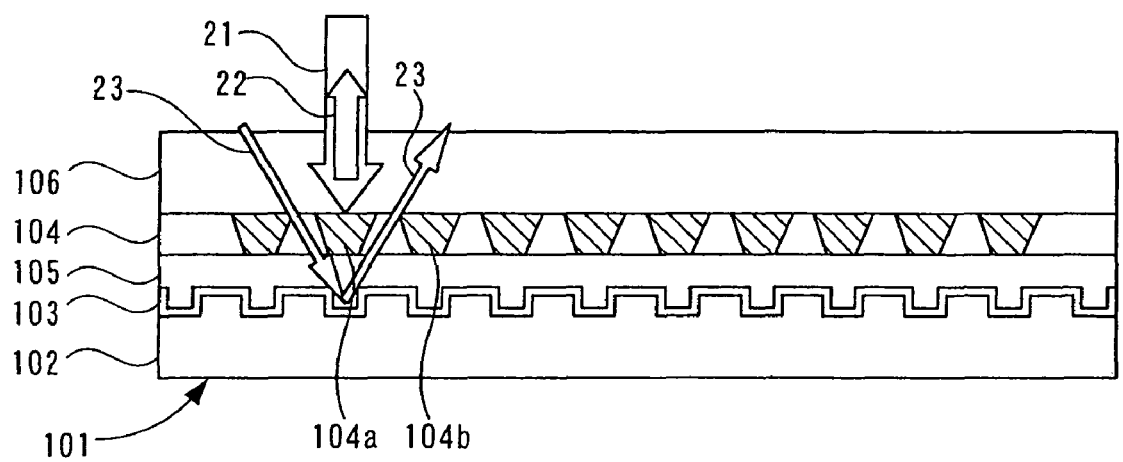
FIG. 2 is a schematic diagram explaining an operation performed during search in the present invention.

FIG. 1 is a flowchart of a search method of the present invention. FIG. 2 is a schematic diagram explaining an operation performed during search in the present invention.

As shown in FIG. 2, a recording medium 101 includes an address layer 103 and a hologram recording layer 104. Address information is recorded in the address layer 103. A plurality of holograms 104*a* and 104*b* are recorded in the hologram recording layer 104. Furthermore, in FIG. 2, the recording medium 101 includes a substrate 102, a wavelength selection and reflection layer 105, and a protective layer 106. A search light 21 passes through the protective layer 106 and is irradiated onto the holograms 104*a* and 104*b* recorded in the hologram recording layer 104 of the recording medium 101. A reproduction light 22 generated from the holograms 104*a* and 104*b* is reflected by the wavelength selection and reflection layer 105. The reproduction light 22 passes through the protective layer 106 and is emitted from a surface of the recording medium 101 on the protective layer side. An address light 23 passes through the protective layer 106, the hologram recording layer 104, and the wavelength selection and reflection layer 105 and is irradiated onto the address layer 103. The address light 23 carries the address information recorded in the address layer. In FIG. 2, the address layer 103 has a reflection layer. The address light 23 modulated by the address information is reflected by the reflection layer of the address layer 103 and emitted from the surface of the recording medium 101 on the protective layer side.

In the search method of the present invention, first, when a search condition, such as a keyword, an image, or a data format, is entered (S1 in FIG. 1), the search light 21 (see FIG. 2) is generated (S2 in FIG. 1). The search light 21 is then irradiated onto the hologram 104*a* recorded in the hologram recording layer 104 of the recording medium 101 (S3 in FIG. 1).

Next, whether a reproduction light from the recording medium 101 is detected is judged (S4 in FIG. 1). When the reproduction light 22 (see FIG. 2) is detected (Yes), the address light 23 (see FIG. 2) reads the address information recorded in the address layer 103 of the recording medium 101. Address information of the hologram 104*a* that has generated the reproduction light 22 is identified and the identified address information is recorded (S5 in FIG. 1). Subsequently, whether the search is continued is judged (S6 in FIG. 1). When the search is not continued (No), the operation is completed.

When the reproduction light from the recording medium 101 is not detected (No at S4) and when the search is continued (Yes at S6), irradiation target is changed to another hologram 104*b* in the hologram recording layer 104 (S7 in FIG. 1). The operation then returns to a process (S3 in FIG. 1) for irradiating the search light 21 onto the hologram 104*b* recorded in the hologram recording layer 104 of the recording medium 101.

In this way, whether the reproduction light 22 is present is detected during the search. When the reproduction light 22 is detected, the address information of the hologram is recorded. As a result, information can be quickly retrieved.

A reproduction light intensity can be detected when the reproduction light is detected, and the reproduction light intensity can be recorded in association with the address information. The stronger the correlation between the search condition and the information is, the larger the reproduction light intensity. Therefore, the degree of correlation between the search condition and the information can be known by the reproduction light intensity. In a process for detecting the reproduction light (S4), even when the reproduction light is detected, if the intensity is a certain value (referred to, hereinafter, as a "threshold value") or less, the reproduction light can be considered undetected. The operation can then proceed to a process for changing the irradiation target (S7 in FIG. 1). Here, the threshold value affects ambiguity of the search. In other words, when the threshold value is small, even pieces of information that are only slightly related are given as search results. However, when the threshold value is large, only pieces of strongly related information are given as the search results.

When the search is completed, the recorded address information is outputted in a recognizable state. To output the address information in the recognizable state, for example, the address information is outputted as is. Alternatively, a hologram corresponding with the recorded address information is reproduced and at least a portion of the hologram is outputted. Moreover, a title or the like of data recorded in the hologram in association with the address information can be recorded in the recording medium 101 or a recording section of a search device in advance. The title or the like of the data in the hologram corresponding to the recorded address information can then be outputted. When the title or the like of the data recorded in the hologram in association with the address information is recorded in the recording medium 101 in advance, the title or the like can be recorded as a separate, dedicated hologram. Alternatively, the title or the like can be recorded in the recordable address layer 103. Alternatively, a recording section such as a semiconductor memory can be provided in the recording medium 101 and the title or the like can be recorded in the recording section.

When the reproduction light intensity is recorded, address information with the highest reproduction light intensity can be outputted in the recognizable state. Moreover, pieces of address information recorded in order, from the address information with the highest reproduction light intensity, can be outputted in the recognizable state. For example, the pieces of address information can be reordered from the address information with the highest reproduction light intensity and the reordered pieces of address information can be outputted. Alternatively, a hologram of the address information with the highest reproduction light intensity can be reproduced and outputted.

Through use of the above-described search method, after holograms in which the pieces of information related to the search condition are recorded are narrowed to a certain degree, each of the narrowed holograms can be reproduced. Then, whether a content of the reproduced information matches the search condition can be further searched. In this case, it is efficient to reproduce the hologram of the address information having the highest reproduction light intensity and search the content of the information.

The address light 23 can read the address information only when the reproduction light is generated. However, the address light 23 preferably continually reads the address information. In particular, the address light 23 preferably reads servo information for positioning and feeds back the servo information for positioning performed when the search light 21 is irradiated onto the hologram.

Various conditions can be set to judge whether the search is continued (S6 in FIG. 1). For example, the search can be completed when the reproduction light is detected. Alternatively, the search can be completed when the number of times the reproduction light is detected exceeds a certain value. Alternatively, the search can be completed when the reproduction light intensity exceeds a certain value.

Moreover, information related to the hologram from which the reproduction light is generated during the search can be recorded in the recording medium. The information related to the hologram is the address information of the hologram from which the reproduction light is generated, the reproduction light intensity, and the like. The information can be related only to the hologram with the highest reproduction light intensity or to all holograms from which the reproduction light is generated. To record the information related to the hologram from which the reproduction light is generated in the recording medium, the information can be recorded as a separate, dedicated hologram. Alternatively, the information can be recorded in the recordable address layer 103. Alternatively, the recording section such as the semiconductor memory can be provided in the recording medium 101 and the information can be recorded in the recording section.

As a result of the information related to the hologram from which the reproduction light is generated being recorded in this way, a hologram with a high search frequency can be known from among the plurality of holograms recorded in the recording medium. The order in which the search light is irradiated on the holograms during search can be controlled through use of the information related to the hologram from which the reproduction light is generated. For example, holograms having a search frequency of a certain number of times or more can be searched first. Alternatively, the holograms can be searched in order, from that with the highest search frequency. As a result, the information can be efficiently retrieved.

Moreover, collected search frequency information itself becomes useful. For example, a ranking of access frequency can be created from data included within the recording medium. Trends (market needs) regarding data of interest can also be studied. Pieces of data with a certain frequency or more can be extracted from a plurality of types of recording media, and a recording medium in which notable pieces of data are collected can be created (for example, a greatest hits collection in terms of music compact discs [CD]).

The recording medium 101 in FIG. 2 is described as follows. The recording medium 101 can be disk-shaped, rectangular card-shaped, or the like. When the recording medium 101 is disk-shaped, information can be efficiently recorded and reproduced by the recording medium 101 being rotated and driven.

The address layer 103 can be a reproduction-only layer in which the address information is recorded in advance. Alternatively, the address layer 103 can be a layer in which information can be recorded and reproduced, and the address information can be written in the address layer 103. In addition to the address information, servo information, identifying information of the recording medium such as recording medium capacity and recording medium configuration, and the like can also be recorded in the address layer 103.

As shown in FIG. 2, a layer in which pits are formed in advance can be used as the reproduction-only address layer 103. Information can be reproduced by changes in reflectance and transmittance caused by concavity and convexity of the pits. A reflection layer is preferably formed in the recording medium 101 when the information is reproduced by changes in the reflectance or to detected changes in the transmittance on an incident surface side. Concavities and convexities can be formed on a surface of the substrate 102 and a reflection surface can be formed as required on the uneven surface, thereby forming the pits. Alternatively, a configuration such as that in which a pit formation layer is formed on the substrate 102, the concavities and convexities are formed on the layer by an etching process or the like, and a reflection layer is formed as required on the uneven surface can be used. When the address layer 103 is reflective is described in FIG. 2. However, when the address layer 103 is transmissive, the light detector detecting the address light is disposed on a back surface side of the recording medium 101.

An organic dye layer, a phase change layer, and the like can be used as the address layer 103 in which recording and reproduction can be performed. When the address layer 103 is the organic dye layer, information can only be recorded once. The pits are formed by a laser beam decomposing the dye. Information can be reproduced from the formed pits by the changes in the reflectance or the transmittance, like the pits in the reproduction-only layer. When the address layer 103 is the phase change layer, information can be rewritten. A crystal structure of the phase change layer is changed as a result of heating by a laser beam. A crystallized section and a non-crystallized section are formed. Information can be recorded by differences in reflectance or transmittance between the crystallized section and the non-crystallized section.

The holograms 104a and 104b formed by the interference between the information light and the recording reference light are recorded in the hologram recording layer 104. It is particularly preferable that wavelengths of the information light, the recording reference light, the reproduction reference light, and the search light 21 and a wavelength of the address light 23 are changed, and the hologram recording layer 104 is made from a material that is photosensitive to the information light, the recording reference light, the reproduction reference light, and the search light 21 and not photosensitive to the address light 23. For example, a photopolymer material can be used as the hologram recording layer 104. When a photopolymer material photosensitive to green and blue lights is used as the material for the hologram recording layer 104, a green or blue light is used as the information light, the recording reference light, the reproduction reference light, and the search light 21. A light, such as a red light, having a wavelength other than that of the green and blue lights is used as the address light. In the present invention, the hologram recording layer 104 is not limited to the photopolymer material.

A plastic substrate, such as polycarbonate, a glass substrate, a metal substrate, and the like can be used as the substrate 102. When the plastic substrate is used, the pits serving as the address layer can be easily formed through formation of concave and convex shapes on a surface by pressing. The glass substrate is high in strength and smoothness. Effects of tilting caused by deformation of the substrate and the like can be reduced. The metal substrate can also be used as a reflection layer for the address light 22. The substrate 102 can be disc-shaped or card-shaped. Thickness of the substrate 102 is not particularly limited. However, if the overall recording medium 101 is formed to be 1.2 to 2.4 millimeters, the recording medium 101 can be compatible with CD and digital versatile discs (DVD) currently in use.

The wavelength selection and reflection layer 105 is provided between the address layer 103 and the hologram recording layer 104. The wavelength selection and reflection layer 105 reflects the information light, the recording reference light, the reproduction reference light, and the search light 21 and transmits the address light 23. A dichroic mirror layer or cholesteric liquid crystal layer in which a high diffraction rate material and a low diffraction rate material are alternately layered can be used as the wavelength selection and reflection layer 105. A reflection surface of the wavelength selection and reflection layer 105 is preferably flat to allow information to be stably recorded and reproduced.

The protective layer 106 is formed on the surface of the recording medium 101 on the incident surface side. The protective layer 106 protects the recording medium 101. The protective layer 106 is formed by, for example, a resin material, for example, a material such as an ultra-violet (UV) resin being applied to the hologram recording layer 104 by spin-coating or the like, or a resin sheet such as a polycarbonate sheet or a resin substrate being adhered.

Figure 3:
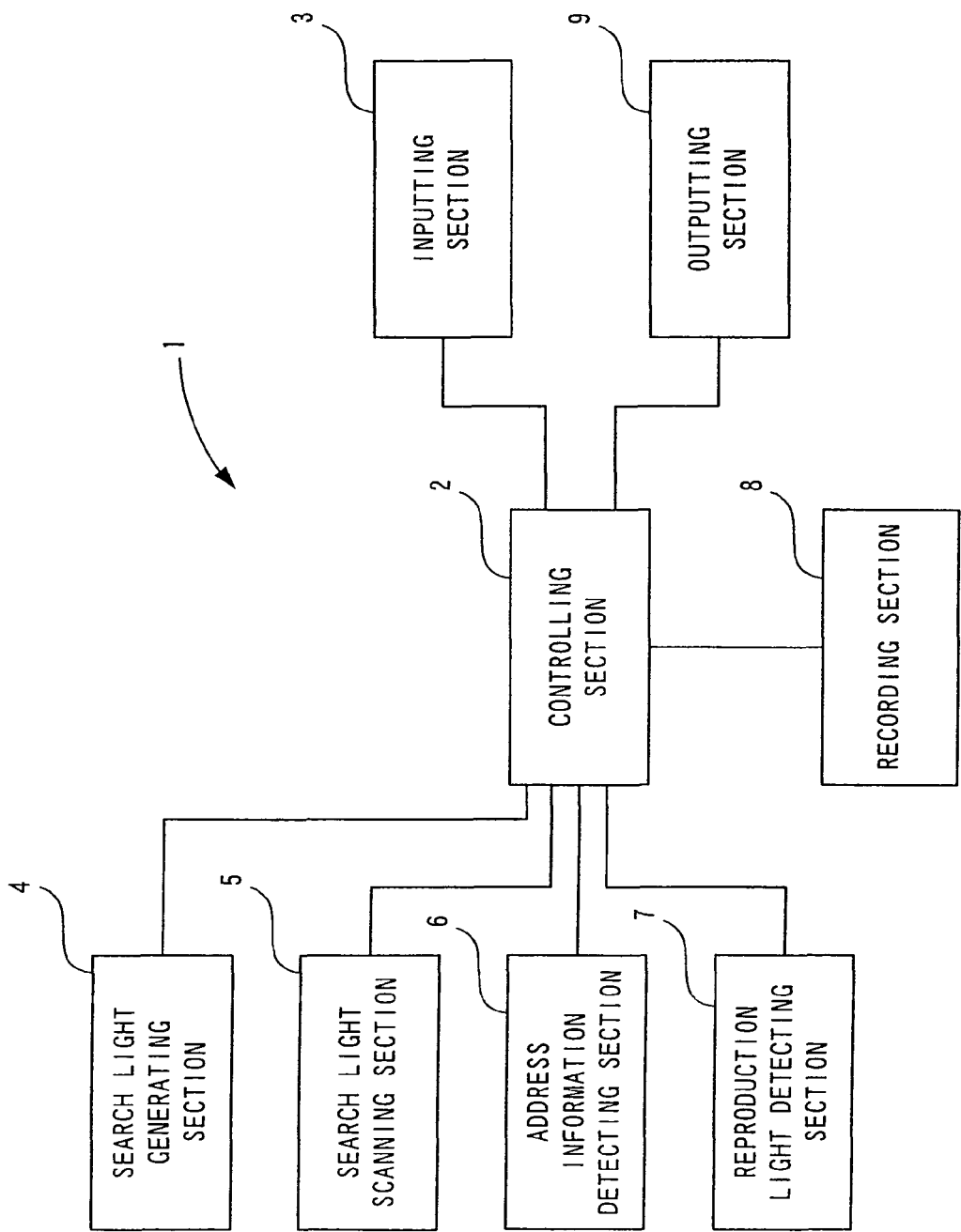
FIG. 3 is a block diagram of a search device using the search method of the present invention.

FIG. 3 is an example of a block diagram of a search device 1 using the search method of the present invention. As shown in FIG. 3, the search device 1 includes a controlling section 2. The search device 1 also includes an inputting section 3, a search light generating section 4, a search light scanning section 5, an address information identifying section 6, a reproduction light detecting section 7, a recording section 8, and an outputting section 9 that are connected to the controlling section 2. A computer to which a hologram reproduction device is connected can be used as the search device 1.

The controlling section 2 controls functions of the overall search device 1. A central processing unit (CPU) and the like can be used as the controlling section.

A searcher enters the search condition into the search device 1 by the inputting section 3. The inputting section 3 enters text information, image information, voice information, and the like. Therefore, a keyboard, a digital camera, a mouse, a voice recognition inputting device, and the like can be used accordingly as the inputting section 3, depending on the information to be entered.

The search light generating section 4 spatially modulates light using a search spatial modulation pattern formed based on the search condition and generates the search light 21. For example, a spatial light modulator such as a digital micromirror device (DMD), a matrix-type liquid crystal element, and the like, can be used as the search light generating section 4. The DMD can spatially modulate the intensity of an incident light by changing a reflection direction for each pixel and can spatially modulate the phase of the incident light by changing a reflection position for each pixel. The liquid crystal element can spatially modulate the intensity and the phase of the incident light by controlling an orientation state of the liquid crystal for each pixel. For example, the phase of an outgoing light for each pixel can be set to one of two values differing from each other by only n radian, thereby spatially modulating the phase of the light.

Figure 4:
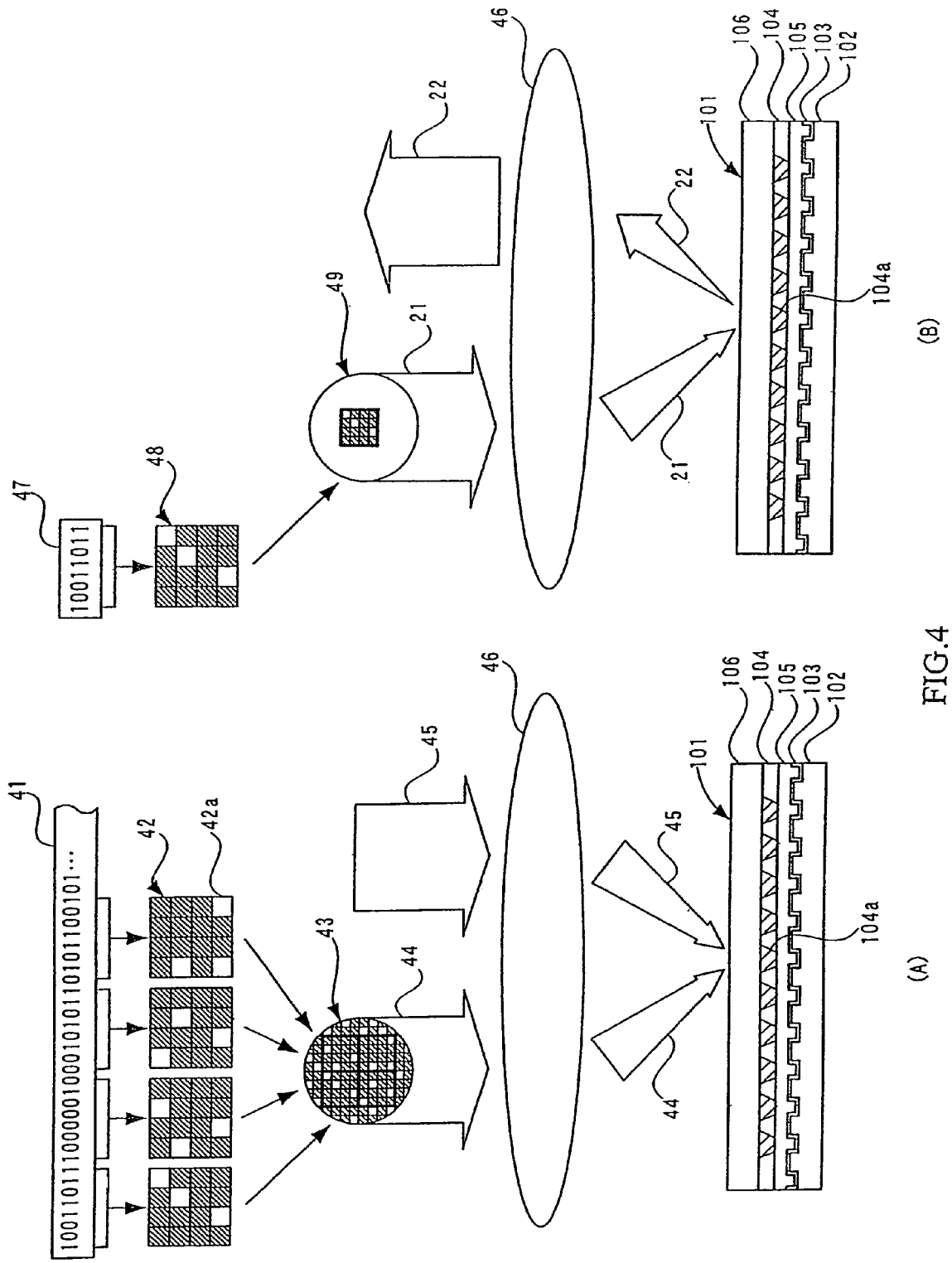
FIG. 4(A) is a schematic diagram explaining an operation performed during recording, and (B) is a schematic diagram explaining an operation performed during search.
Figure 5:
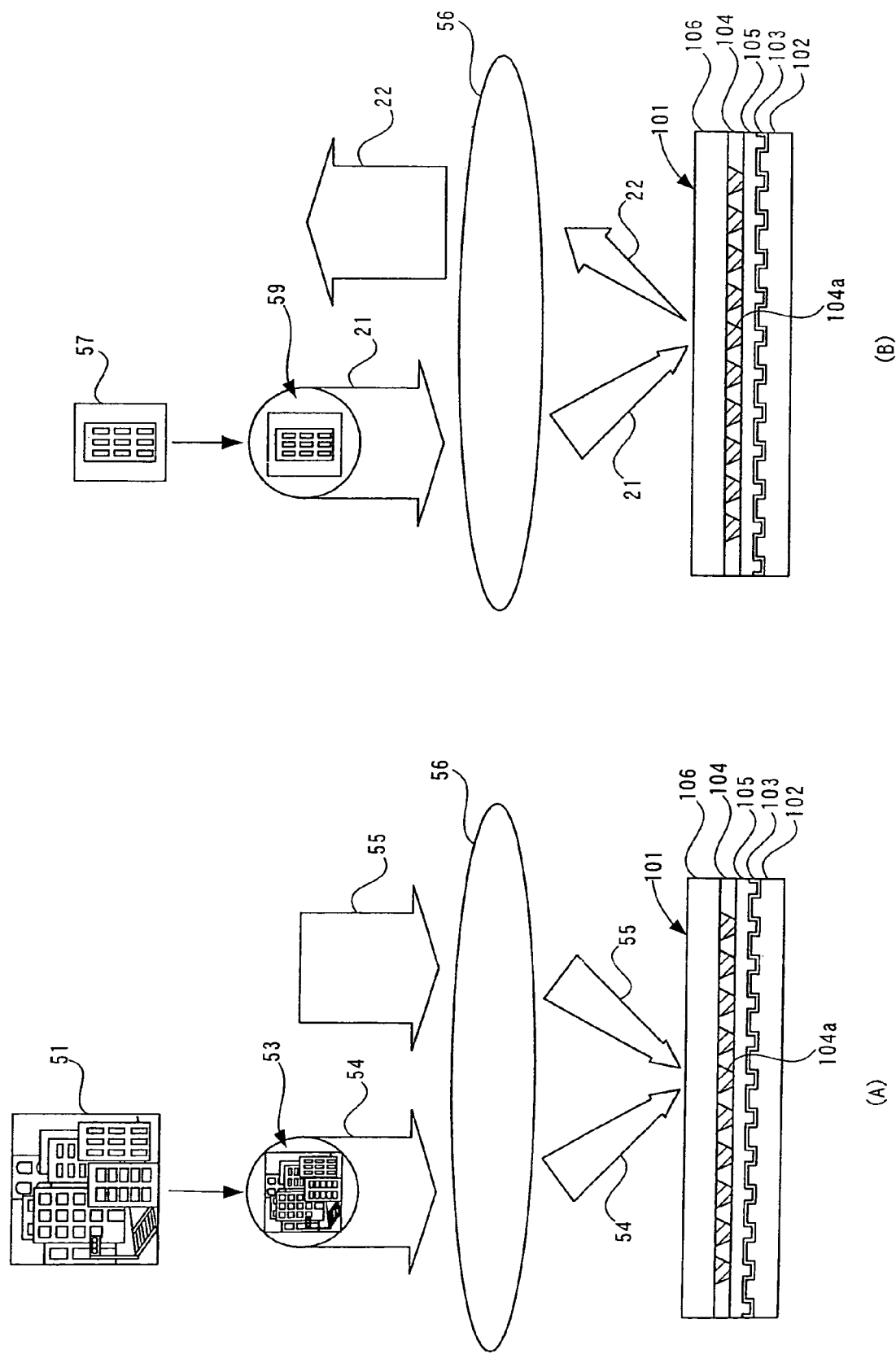
FIG. 5(A) is a schematic diagram explaining an operation performed during recording, and (B) is a schematic diagram explaining an operation performed during search.
Figure 6:
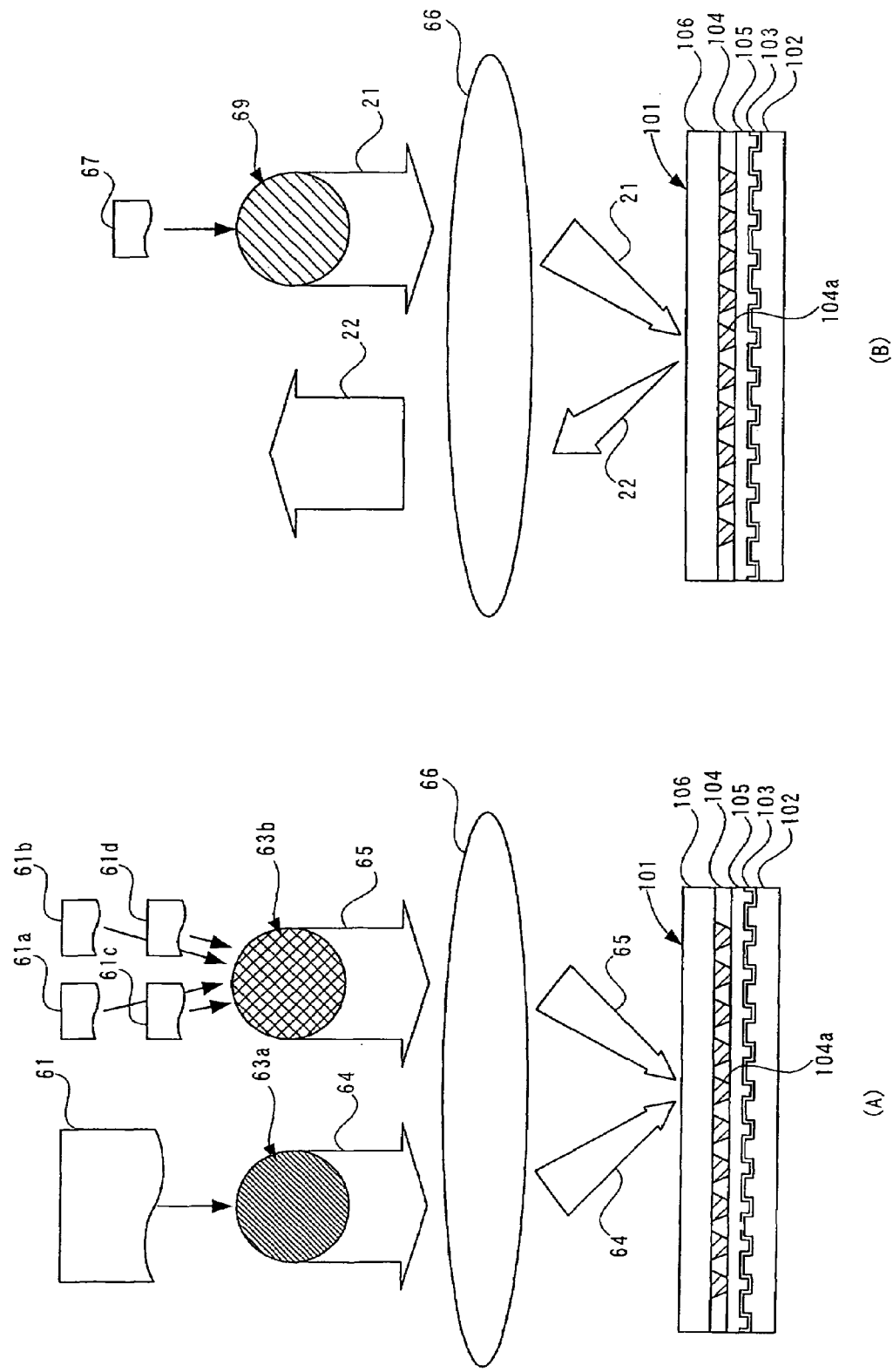
FIG. 6(A) is a schematic diagram explaining an operation performed during recording, and (B) is a schematic diagram explaining an operation performed during search.

The search spatial modulation pattern is formed such as to interfere with the hologram 104a in which the information related to or similar to the search condition is recorded, depending on the recording method of the hologram 104a recorded in the hologram recording layer 104 of the recording medium 101. FIG. 4 to FIG. 6 each show an embodiment of a search spatial modulation pattern formation method.

FIG. 4(A) describes an operation for recording the hologram 104a in the hologram recording layer 104 of the recording medium 101. An information light spatial modulation pattern 43 is generated using two-dimensional pattern information 42. The two-dimensional pattern information 42 is information 41 to be recorded that is converted based on a certain conversion method. FIG. 4(A) shows a method for converting every eight bits of information 41 to be recorded to a symbol unit of the two-dimensional pattern information 42. In the symbol unit of the two-dimensional pattern information 42, three pixels among 4×4 pixels are ON pixels 42a. Each symbol unit identifies information by placement of the three ON pixels 42a within the 4×4-pixel area. There are $_{16}C_3$=560 possible placements of the three ON pixels 42a within the 4×4-pixel area. Therefore, 256 kinds of 8-bit information can be expressed. In particular, in each symbol unit, when ON pixels 42a are adjacent, frequency components of when a Fourier transform is performed decreases. Therefore, among the 560 possible placements, a placement in which the ON pixels 42a are not adjacent is preferably selected as each symbol unit. The symbol units of the two-dimensional pattern information 42 are disposed, and the information light spatial modulation pattern 43 is generated. The method of converting the information 41 to be recorded to the two-dimensional pattern information 42 is not limited to the above-described method.

An information light 44 spatially modulated by the information light spatial modulation pattern 43 and a recording reference light 45 are irradiated by an object lens 46 such as to converge on the hologram recording layer 104 of the recording medium 101. Interference fringes formed by interference between the information light 44 and the recording reference light 45 are recorded in the hologram recording layer 104 as the hologram 104a.

Next, FIG. 4(B) describes a search operation. When search information 47 is entered as the search condition, the search information 47 is converted into two-dimensional pattern information 48 by the conversion method used when the information light spatial modulation pattern 43 is generated. A search spatial modulation pattern 49 including the two-dimensional pattern information 48 is generated. The search light 21 is generated using the search spatial modulation pattern 49. Here, the search spatial modulation pattern 49 is preferably disposed within the same area in a cross-section perpendicular to an optical axis of the light as the area in which the information light spatial modulation pattern 43 is disposed during recording. The search light 21 is preferably irradiated at the same angle as a lighting angle of the information light 44 during recording. When the search light 21 is irradiated onto the hologram 104a, interference occurs between the hologram 104a and the search light 21 when a correlation is present between the search spatial modulation pattern 49 of the search light 21 and the information light spatial modulation pattern 43 of the information light 44 recorded in the hologram 104a. The reproduction light 22 having an intensity adhering to the degree of correlation is generated. In FIG. 4, the same two-dimensional information as the two-dimensional information 48 that is the converted search information 47 is included in the information light spatial modulation pattern 43. Therefore, when the search light 21 is irradiated onto the hologram 104a, the reproduction light 22 is generated. In this case, the reproduction light 22 is a light corresponding with the recording reference light 45 during recording.

In particular, as shown in FIG. 4(A), when the information light 44 is irradiated onto the recording medium 101 by the object lens 46, the interference fringes are formed by the frequency components of when the Fourier transform is performed on the information light spatial modulation pattern 43. Therefore, even when the search spatial modulation pattern 49 of the search light 21 does not completely match the information light spatial modulation pattern 43, interference occurs if there is a similar frequency component. The reproduction light 22 having an intensity adhering to the degree of correlation is generated.

In FIG. 5(A), an information light 54 is generated during recording with image information 51 serving as an information light spatial modulation pattern 53. The information light 54 and a recording reference light 55 are irradiated by an object lens 56 such as to converge on the hologram recording layer 104 of the recording medium 101. The interference fringes formed by the interference between the information light 54 and the recording reference light 55 are recorded in the hologram recording layer 104 as the hologram 104a.

Next, when image information 57 is entered as the search condition, as shown in FIG. 5(B), the searchlight 21 is generated with the image information 57 serving as the search spatial modulation pattern 59. Here, the search spatial modulation pattern 59 is preferably disposed in the same area in the cross-section perpendicular to the optical axis of the light as the area in which the information light spatial modulation pattern 53 is disposed during recording. The search light 21 is preferably irradiated at the same angle as the lighting angle of the information light 54 during recording. When the search light 21 is irradiated onto the hologram 104a, interference occurs between the hologram 104a and the search light 21 when a correlation is present between the search spatial modulation pattern 59 (image information 57) of the search light 21 and the information light spatial modulation pattern 53 (image information 51) of the information light 54 recorded in the hologram 104a. The reproduction light 22 having an intensity adhering to the degree of correlation is generated. Patterns having a high degree of correlation, namely patterns that are similar, have strong interference. Therefore, the reproduction light 22 intensity increases. Patterns having a low degree of correlation, namely patterns that are not similar, have weak interference. Therefore, the reproduction light 22 intensity decreases. In this case, the reproduction light 22 is a light corresponding to the recording reference light 55 during recording.

In particular, as shown in FIG. 5(A), when the information light 54 is irradiated onto the recording medium 101 by the object lens 56, the interference fringes are formed by the frequency components of when the Fourier transform is performed on the information light spatial modulation pattern 53. Therefore, even when the search spatial modulation pattern 59 (image information 57) of the search light 21 does not completely match the information light spatial modulation pattern 53 (image information 51), if there is a similar frequency component, the reproduction light is generated depending on the degree of correlation.

Recording the image information 51 and retrieving the image information 57 as shown in FIG. 5 can be performed when, for example, footage from a security camera is searched for a certain person.

In FIG. 6(A), an information light spatial modulation pattern 63 is formed based on information 61 to be recorded. An information light 64 that is spatially modulated using the information light spatial modulation pattern 63 is generated. A recording reference light spatial modulation pattern 63b is formed based on pieces of keyword information 61a to 61d related to the information 61 to be recorded. A recording reference light 65 that is spatially modulated using the recording reference light spatial modulation pattern 63b is generated. The information light 64 and the recording reference light 65 are irradiated by an object lens 66 such as to converge on the hologram recording layer 104 of the recording medium 101. The interference fringes formed as a result of the interference between the information light 64 and the recording reference light 65 are recorded in the hologram recording layer 104 as the hologram 104*a*.

Keywords, images, data format, and the like that can be used as the search condition are set in advance as the keyword information 61*a* to 61*d*. Relevant information can be manually or automatically extracted and acquired from the information 61 to be recorded. The keyword information 61*a* to 61*d* corresponding to the information 61 to be recorded can also be separately prepared. As a result of the recording reference light spatial modulation pattern 63*b* being formed based on the keyword information 61*a* to 61*d*, the recording reference light 65 can carry the keyword information 61*a* to 61*d*. As a formation method for the recording reference light spatial modulation pattern 63*b*, for example, the recording reference light spatial modulation pattern 63*b* can be formed using the two-dimensional pattern information, like the information light 44 in FIG. 4(A). The two-dimensional pattern information is the keyword information 61*a* to 61*d* converted based on a certain conversion method. Like the information light 54 in FIG. 5(A), the keyword information 61*a* to 61*d* can be included in at least a portion of the recording reference light spatial modulation pattern 63*b* as the image information.

Next, when a search condition 67 is entered, as shown in FIG. 6(B), a search spatial modulation pattern 69 is generated based on the search condition 67. The search light 21 carrying the search condition 67 is generated. Here, the search light 21 is preferably made to carry the search condition 67 by the same method as when the recording reference light 65 carries the keyword information 61*a* to 61*d* during recording. The search light 21 is preferably irradiated at the same angle as the lighting angle of the recording reference light 65 during recording. When the search light 21 is irradiated onto the hologram 104*a*, interference occurs between the hologram 104*a* and the search light 21 when a correlation is present between the search condition 67 carried by the search light 21 and the recording reference light 65 recorded in the hologram 104*a*. The reference light 22 having an intensity adhering to the degree of correlation is generated. Patterns having a high degree of correlation, namely patterns that are similar or in which a plurality of search conditions match the keyword information 61*a* to 61*d*, have strong interference. Therefore, the reproduction light 22 intensity increases. Patterns having a low degree of correlation, namely patterns that are not similar, have weak interference. Therefore, the reproduction light 22 intensity decreases. In this case, the reproduction light 22 is a light corresponding to the information light 64 during recording.

In particular, as shown in FIG. 6(A), when the recording reference light 65 is irradiated onto the recording medium 101 by the object lens 66, the interference fringes are formed by the frequency components of when the Fourier transform is performed on the keyword information 61*a* to 61*d* carried by the recording reference light 65. Therefore, even when the search condition of the search light 21 does not completely match the keyword information 61*a* to 61*d*, if there is a similar frequency component, the reproduction light is generated depending on the degree of correlation.

As a method of forming the information light spatial modulation pattern based on the information 61 to be recorded in FIG. 6, the methods and the like used in FIG. 4(A) or FIG. 5(A) can be used. The search method shown in FIG. 4 or FIG. 5 can also be used in combination.

When the information light spatial modulation pattern 63*a* and the recording reference light spatial modulation pattern 63*b* are not superimposed on an entrance plane of the object lens 66 in FIG. 6(A), the information light spatial modulation pattern 63*a* and the recording reference light spatial modulation pattern 63*b* can be displayed in a single spatial light modulator. The information light 64 and the recording reference light 65 can be simultaneously generated. The information light spatial modulation pattern 63*a* and the recording reference light spatial modulation pattern 63*b* can also be displayed in separate spatial light modulators. The information light 64 and the recording reference light 65 can be respectively generated. As when the recording reference light 45 or 55 in FIG. 3(A) or FIG. 4(A) is spatially modulated, when the recording reference spatial modulation pattern is not superimposed with the information light spatial modulation pattern, the information light and the recording reference light can be generated by a single spatial light modulator.

The search light scanning section 5 (FIG. 3) irradiates the search light 21 onto the hologram recording layer 104 of the recording medium 101 and scans the irradiation position of the search light 21 over each hologram 104*a* and 104*b* recorded in the hologram recording layer 104. For example, the search light scanning section 5 can perform scanning by moving the recording medium 101. Alternatively, the search light scanning section 5 can perform scanning by moving the search light 21. Alternatively, the search light scanning section 5 can perform scanning by moving both the recording medium 101 and the search light 21. As a means for moving the recording medium 101, a motor that rotates the recording medium or an X-Y stage can be used. As a means for moving the search light 21, a pick-up device emitting the search light 21 can be moved or an optical system within the pick-up device can be moved. In addition to the search light 21, the search light scanning section 5 can preferably scan the irradiation position of the address light 23 such that the address information of each hologram 104*a* can be identified.

The address information identifying section 6 reads the address information recorded in the address layer 103 of the recording medium 101 and identifies the address information of a predetermined hologram. A light source that emits the address light 23, a light-receiving element that receives the returning light, and an element having an analyzing section can be used as the address information identifying section 6. For example, the light source irradiates the address light 23 onto the address layer 103. The light-receiving element receives the returning light. The analyzing section reads the address information recorded in the address layer 103. When the address information is recorded such as to correspond one-to-one in each hologram 104*a*, the address information of the predetermined hologram can be identified by the corresponding address information being read. When the position of the hologram is recorded in correlation with the address information, the address information of the hologram can be identified by analysis of the read address information. For example, with the address information recorded in the address layer 103 as a reference, when a position of the hologram is recorded in association with a clock speed from the reference, the read address information and the clock speed until the hologram is reproduced can be recorded from time to time in a memory for temporary storage. The address information of the hologram can be identified from the address information can the clock speed. Some functions of the controlling section can be used as the analyzing section of the address information identifying section 6.

The reproduction light detecting section 7 detects the reproduction light 22 generated from the hologram recording layer 104 of the recording medium 101. The reproduction light detecting section 7 is merely required to at least detect whether the reproduction light 22 has been generated. A CCD-type solid-state image sensing device or a metal-oxide semiconductor (MOS)-type solid-state image sensing device can be used. Moreover, the reproduction light detecting section 7 can preferably detect the intensity of the reproduction light. The reproduction light 22 sometimes carries the spatial modulation pattern as the information. However, to detect the spatial modulation pattern, the reproduction light detecting section 7 is required to have a large number of light-detecting pixels arrayed in a grid-form and light is required to be detected for each light-receiving pixel. In the present specifications, a detection means for detecting the spatial modulation pattern is referred to as a reproduction information detecting section. The reproduction information detecting section can be provided separately from the reproduction light detecting section 7. Alternatively, the large number of light-detecting pixels arrayed in the grid-form can be provided as the reproduction light detecting section 7, and the reproduction light detecting section 7 can also be sued as the reproduction information detecting section.

The recording section 8 is provided in the search device 1 and used to record information. A semiconductor memory, a hard disk drive (HDD), and the like can be used as the recording section 8.

The outputting section 9 is used to output the search results. A display, a printer, a speaker, a transmitting modem that outputs the search results as data, a transmission cable, and the like can be used as the outputting section 9.

Figure 7:
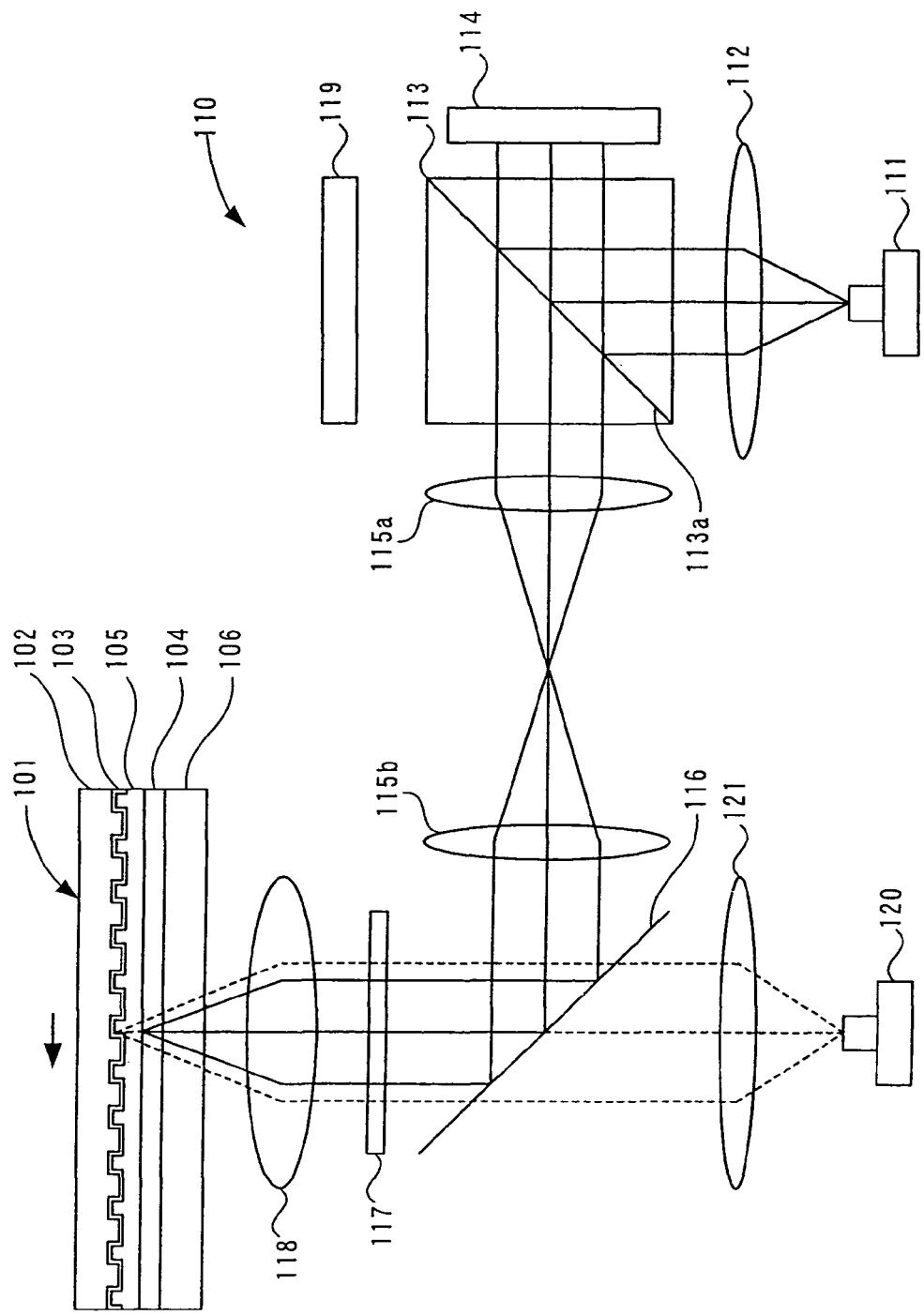
FIG. 7 is a schematic configuration diagram of a search device also used as a hologram recording and reproduction device, according to an embodiment.

FIG. 7 is a schematic configuration diagram of a search device 110 according to the embodiment that is also used as a hologram recording and reproduction device. The search device 110 includes a recording and reproduction light source 111, a first collimator lens 112, a polarizing beam splitter 113, a spatial modulator (information expressing section) 114, a pair of relay lenses 115a and 115b, a dichroic mirror 116, a ¼ wavelength plate 117, an object lens 118, a light detecting section 119, an address information reading element 120, and a second collimator lens 121. In FIG. 7, the recording medium 101 in which the information is recorded includes the substrate 102, the reflective address layer 103, the hologram recording layer 104, the wavelength selection and reflection layer 105, and the protective layer 106.

The recording and reproduction light source 111 emits light for forming the information light and the reference light used to record information, light for forming the reference light used to reproduce information, and light for forming the search light used to search for information. A semiconductor, for example, that generates a pencil of rays of coherent, linearly polarized light can be used as the light source 111. A blue laser or a green laser is preferably used as the recording and reproduction light source 111 because a short wavelength is more advantageous when performing high-density recording. A solid laser can also be used as the light source 111.

The first collimator lens 112 turns a divergent pencil of rays from the recording and reproduction light source 111 into an almost parallel beam.

The polarizing beam splitter 113 has a semi-reflective surface 113a that reflects or transmits a linearly polarized light (for example, P-polarized light) and transmits or reflects a linearly polarized light (for example, S-polarized light) perpendicular to the polarized light. In FIG. 7, the polarizing beam splitter 113 reflects the pencil of rays emitted from the recording and reproduction light source 111 towards the spatial light modulator 114 and transmits the information light and the reference light of which a polarization direction is rotated 90 degrees by the spatial light modulator 114.

The spatial light modulator 114. A transmissive or reflective spatial light modulator that has a plurality of pixels arrayed in the grid-form and can modulate the phase and/or the intensity of outgoing light for each pixel can be used as the spatial light modulator 114. The DMD and the matrix-type liquid crystal element can be used as the spatial light modulator 114. The DMD can spatially modulate the intensity of an incident light by changing a reflection direction for each pixel and can spatially modulate the phase of the incident light by changing a reflection position for each pixel. The liquid crystal element can spatially modulate the intensity and the phase of the incident light by controlling an orientation state of the liquid crystal for each pixel. For example, the phase of an outgoing light for each pixel can be set to one of two values differing from each other by only n radian, thereby spatially modulating the phase of the light. The spatial light modulator 114 in FIG. 7 rotates the polarization direction of the outgoing light by 90 degrees relative to the polarization direction of the incident light.

The light from the light source 111 is spatially modulated by the search spatial modulation pattern shown in a display surface of the spatial light modulator. As a result, the search light can be generated.

Figure 8:
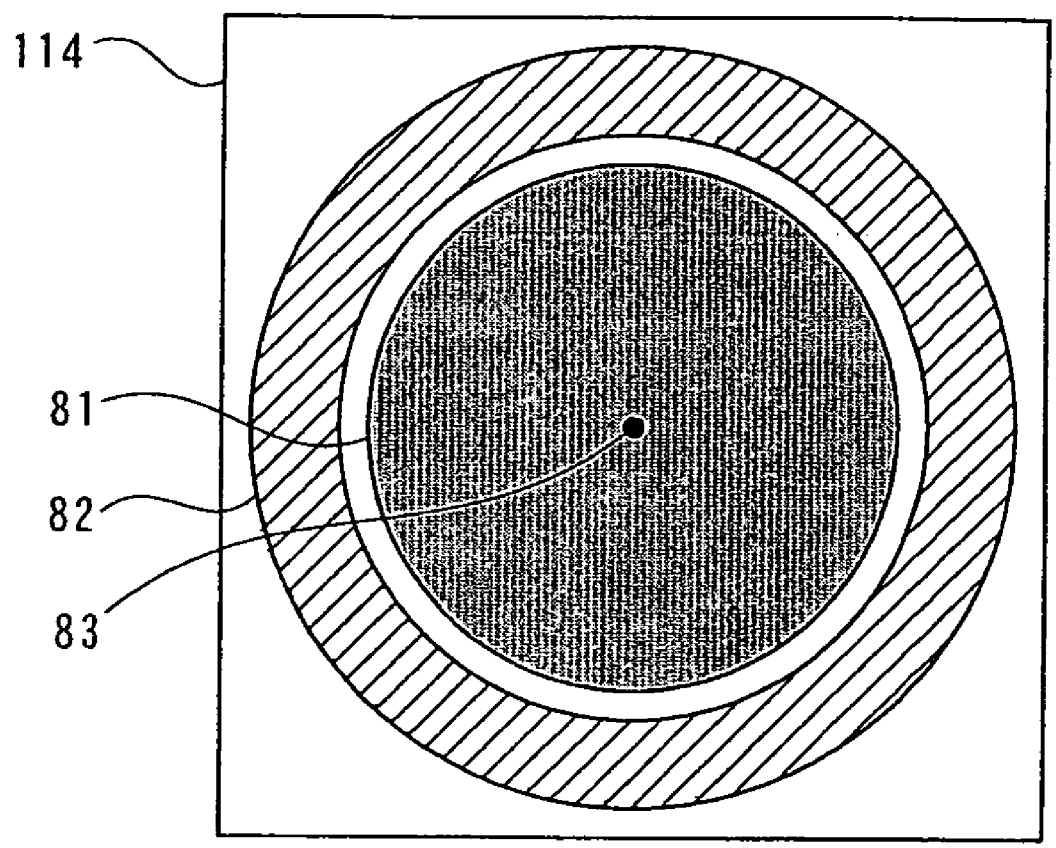
FIG. 8 is a schematic diagram of a display range in a spatial light modulator.

The light from the light source 111 is spatially modulated by the information light spatial modulation pattern and the recording reference light spatial modulation pattern displayed in the display surface of the spatial light modulator 114. As a result, the information light and the recording reference light can be generated. For example, as shown in FIG. 8, an information light spatial modulation pattern 81 can be disposed on a center side and the recording reference light spatial modulation pattern 82 can be disposed around the information light spatial modulation pattern 81. Here, the center of the information light spatial modulation pattern 81 becomes an optical axis of the information light and the center of the recording reference light spatial modulation pattern 82 becomes an optical axis of the recording reference light. However, as shown in FIG. 8, when a center 83 is the same or, in other words, when the optical axis of the information light and the optical axis of the recording reference light are disposed such as to be positioned on a same line and the information light and the recording reference light are irradiated from the same surface side of the substrate, a hologram having characteristics differing from those of a typical two-beam interference-type hologram or Lipman hologram can be formed.

The spatial light modulator 114 generating the information light and the recording reference light can be provided separately. For example, the light from the light source 111 can be divided by a beam splitter or the like. A first spatial light modulator can spatially modulate one light and generate the information light. A second spatial light modulator can spatially modulate another light and generate the recording reference light. In this case, the information light spatial modulation pattern and the recording reference light spatial modulation pattern are required to be formed into images on the entrance surface of the object lens 118. Therefore, the spatial light modulator generating the information light and the spatial light modulator generating the recording reference light have a conjugated relationship, and the information light and the recording reference light are carried by the pair of relay lenses 115a and 115b.

Furthermore, the light from the light source 111 is spatially modulated by the reproduction reference light spatial modulation pattern displayed in the display surface of the spatial light modulator 114. As a result, the reproduction reference light can be generated.

The pair of relay lenses 115a and 115b are disposed between the spatial light modulator 114 and the object lens 118. The pair of relay lenses 115a and 115b are disposed such as to form the images displayed in the spatial light modulator 114 on the entrance surface of the object lens 118. In other words, the pair of relay lenses 115a and 115b are disposed such that a distance from the spatial light modulator 114 to a first relay lens 115a is a focal distance f1 of the first relay lens 115a, a distance from the second relay lens 115b to the entrance surface of the object lens 118 is a focal distance f2 of the second relay lens 115b, and a distance between the first and second relay lenses 115a and 115b is a sum of the focal distance f1 of the first relay lens 115a and the focal distance f2 of the second relay lens 115b.

In FIG. 7, the pair of relay lenses 115a and 115b are disposed between the object lens 118 and the light detecting section 119. The pair of relay lenses 115a and 115b are disposed such as to form the image of the reproduction light generated from the hologram recording layer 104 of the recording medium 101 by the reproduction reference light once again on an exit surface of the object lens 118. In other words, the pair of relay lenses 115a and 115b are disposed such that a distance from the exit surface of the object lens 118 to the second relay lens 115b is the focal distance f2, a distance form the first relay lens 115a to the light detecting section 119 is the focal distance f1, and the distance between the first and second relay lenses 115a and 115b is the sum of the focal distance f1 and the focal distance f2.

Placement of the pair of relay lenses 115a and 115b changes by other optical elements being disposed accordingly. For example, when a magnifying lens is disposed between the first relay lens 115a and the light detecting section 119, placement is performed such that the distance from the first relay lens 115a to the entrance surface of the magnifying lens is the focal distance f1.

The dichroic mirror 116 is configured such that, using a difference in wavelength between the light from the address information reading element 120 and the recording and reproduction light, light of one wavelength is transmitted and light of another wavelength is reflected. In FIG. 7, the light from the recording and reproduction light source ill is reflected towards the object lens 118 and the light from the address information reading element 120 is transmitted.

The ¼ wavelength plate 117 is a phase plate that changes a path difference of polarized lights vibrating in mutually perpendicular directions by ¼ wavelength. The light of the P-polarized light is changed to a circularly polarized light by the ¼ wavelength plate 117. Moreover, when the light of the circularly polarized light passes through the ¼ wavelength plate 117, the circularly polarized light is changed to the S-polarized light. The reproduction reference light or the search light and the reproduction light during reproduction or search can be divided by the polarizing beam splitter 113 by the ¼ wavelength plate 117.

During search, the object lens 118 irradiates the search light formed into an image on the entrance surface onto the recording medium 101. During recording, the object lens 118 irradiates the information light and the recording reference light formed into images on the entrance surface onto the recording medium 101, causes interference in the hologram recording layer 104, and performs recording. During reproduction, the object lens 118 irradiates the recording reference light formed into an image on the entrance surface onto the recording medium 101. The reproduction light generated from the hologram recording layer 104 of the recording medium 101 enters the object lens 118 and an image is formed on the exit surface.

The light detecting section 119 is a combination of the reproduction light detecting section and the reproduction information detecting section. The light detecting section 119 has a large number of light-detecting pixels arrayed in a grid-form and light intensity of the received light is detected for each light-receiving pixel. The CCD-type solid-state image sensing device or the MOS-type solid-state image sensing device can be used as the light detecting section 119. A smart optical sensor (for example, refer to document "OplusE, September 1996, No. 202, pages 93 to 99") in which the MOS-type solid-state image sensing device and a signal processing circuit are integrated on a single chip can also be used. The smart optical sensor has a large transfer rate and a high-speed calculation function. Therefore, as a result of the smart optical sensor being used, high-speed search and reproduction can be performed. For example, reproduction can be performed at a transfer rate of Giga-(G)bit/second order.

The address information reading element 120 is an element used to read the address information recorded in the address layer 103 of the recording medium 101. The address information reading element 120 includes a light source that generates the address light, such as a semiconductor laser, and a light detector that receives light returning from the recording medium 101. The light source of the address information reading element 120 preferably does not affect the hologram recording layer 104 of the recording medium 101. Therefore, the wavelength of the light source preferably differs from that of the recording and reproduction light source 111. For example, an infrared laser can be used as the light source of the address information reading element 120. When other information in addition to the address information is recorded in the address layer 103 of the recording medium 101, the information is also read by the address information reading element 120.

The second collimator lens 121 turns the address light from the address information reading element 120 into an almost parallel beam and converges a laser beam returning from the recording medium 101 on the light detector of the address information reading element 120.

First, an operation performed as the search device will be described. The light emitted from the light source 111 is turned into a parallel light by the first collimator lens 112. The polarizing beam splitter 113 reflects the light towards the spatial light modulator 114. Then, the searchlight is generated by the search spatial modulation pattern expressed in the spatial light modulator 114. The search light passes through the polarizing beam splitter 113 and is carried by the pair of relay lenses 115a and 115b such that an image of the spatial modulation pattern expressed in the spatial light modulator 114 is formed on the entrance surface of the object lens 118. During this process, the search light is reflected towards the object lens 118 by the dichroic mirror 116 and passes through the ¼ wavelength plate 117. The search light is then irradiated onto the hologram recorded in the hologram recording layer 104 of the recording medium 101 by the object lens 118.

The address light from the address information reading element 120 is turned into a parallel light by the second collimator lens 121. The light passes through the dichroic mirror 116 and is irradiated onto the recording medium 101 by the object lens 118. In the recording medium 101, the address light passes through the protective layer 106, the hologram recording layer 104, and the wavelength selection and reflection layer 105. The address light is then modulated by the address information recorded in the address layer 103 and reflected. The reflection light of the address light passes through the wavelength selection and reflection layer 105, the hologram recording layer 104, and the protective layer 106 and travels the path in the opposite direction. The address information reading element 120 reads the address information. In FIG. 7, the address light from the address information reading element 120 is indicated by a dotted line and focuses on the address layer 103.

When the reproduction light is generated from the hologram recorded in the hologram recording layer 104 of the recording medium 101 by the search light, the reproduction light is emitted from the recording medium 101 towards the object lens 118 by the wavelength selection and reflection layer 105 of the recording medium 101. An image of the information light spatial modulation pattern is formed on the exit surface of the object lens 118 by the object lens 118. The image is carried by the pair of relay lenses 115a and 115b such that the image is formed once again in the light detecting section 119. During this process, the reproduction light passes through the ¼ wavelength plate 117 and is reflected towards the polarizing beam splitter 113 by the dichroic mirror 116. The polarization direction of the reproduction light is shifted by 90 degrees compared to the reproduction reference light during irradiation because the reproduction light passes through the ¼ wavelength plate 117 twice. Therefore, the reproduction light is then reflected towards the light detecting section 119 by the polarizing beam splitter 113. When the reproduction light is detected, the light detecting section 119 identifies the address information of the hologram from which the reproduction light has been generated from the address information read by the address information reading element 120. The light detecting section 119 then records the identified address information in a memory (not shown). Here, the light detecting section 119 is not required to detect the spatial modulation pattern of the reproduction light and is merely required to detect whether the reproduction light is generated. Therefore, detection time can be a short amount of time. The spatial modulation pattern of the reproduction light can be detected. However, regarding the spatial modulation pattern of the reproduction light reproduced by the search light, not all of the information light spatial modulation pattern may be reproduced. The light intensities detected by the plurality of light-receiving pixels of the light detecting section 119 are preferably added and the intensity of the reproduction light is preferably recorded.

When the reproduction light is generated from the hologram recorded in the hologram recording layer 104 of the recording medium 101 by the search light or when the search is continued even through the reproduction light has been detected, the recording medium 101 is moved (for example, rotated) and the search light is irradiated onto the next hologram. As a result of this process being repeated, if the search light is irradiated onto the entire surface of the recording medium 101, search can be performed on all pieces of information recorded in the recording medium 101. The search can be completed when the reproduction light is generated and the search subject is found. The hologram to become the next search subject can be a hologram that is not adjacent but positioned at a distance.

An operation performed as the light information recording device will be described. The light emitted from the light source 111 is turned into a parallel light by the first collimator lens 112. The polarizing beam splitter 113 reflects the light towards the spatial light modulator 114. Then, the information light and the recording reference light are generated by the information light spatial modulation pattern and the recording reference light spatial modulation pattern expressed in the spatial light modulator 114. The information light and the recording reference light pass through the polarizing beam splitter 113 and are carried by the pair of relay lenses 115a and 115b such that an image of the spatial modulation pattern expressed in the spatial light modulator 114 is formed on the entrance surface of the object lens 118. During this process, the information light and the recording reference light are reflected towards the object lens 118 by the dichroic mirror 116 and pass through the ¼ wavelength plate 117. Then the information light and the recording reference light are irradiated onto the recording medium 101 by the object lens 118. The interference fringes of the information light and the recording reference light are recorded in the hologram recording layer 104 of the recording medium 101.

Furthermore, an operation performed as the light information reproduction device will be described. The light emitted from the light source 111 is turned into a parallel light by the first collimator lens 112. The polarizing beam splitter 113 reflects the light towards the spatial light modulator 114. Then, the reproduction reference light is generated by the reproduction reference light spatial modulation pattern expressed in the spatial light modulator 114. The spatial modulation pattern of the reproduction reference light during reproduction is the spatial modulation pattern of the recording reference light irradiated when the information recorded in the recording medium is recorded. The reproduction reference light passes through the polarizing beam splitter 113 and is carried by the pair of relay lenses 115a and 115b such that an image of the reference light spatial modulation pattern expressed in the spatial light modulator 114 is formed on the entrance surface of the object lens 118. During this process, the reproduction reference light is reflected towards the object lens 118 by the dichroic mirror 116 and passes through the ¼ wavelength plate 117. The reproduction reference light is then irradiated onto the recording medium 101 by the object lens 118. The reproduction reference light is diffracted by the interference fringes recorded in the hologram recording layer 104 of the recording medium 101 and the recording light having the same information as the information light during recording is generated.

The reproduction light is emitted from the recording medium 101 towards the object lens 118 by the wavelength selection and reflection layer 105 of the recording medium 101. An image of the information light spatial modulation pattern is formed on the exit surface of the object lens 118 by the object lens 118. The image is carried by the pair of relay lenses 115a and 115b such that the image is formed once again in the light detecting section 119. During this process, the reproduction light passes through the ¼ wavelength plate 117 and is reflected towards the polarizing beam splitter 113 by the dichroic mirror 116. The polarization direction of the reproduction light is shifted by 90 degrees compared to the reproduction reference light during irradiation because the reproduction light passes through the ¼ wavelength plate 117 twice. Therefore, the reproduction light is then reflected towards the light detecting section 119 by the polarizing beam splitter 113. Finally, the light detecting section 119 detects the spatial modulation pattern of the reproduction light. The detected information is sent to the controlling section (not shown) and decoded in the controlling section. The decoded information is reproduced.

Servo information for positioning can be recorded in the address layer 101 of the recording medium 101. The address information reading element 120 can read the servo information and perform positioning when the search light, the information light, the recording reference light, and the reproduction reference light are irradiated. The address information can also be used as the servo information.

The present invention is not limited to the above-described embodiment, and modifications can be made as required. For example, in the device shown in FIG. 7, the information light and the recording reference light are irradiated from the same surface side of the recording medium such that the optical axis of the information light and the optical axis of the recording reference light are on a same line. However, the search method of the present invention can be performed even when the hologram is the Lipman hologram irradiated from the opposite side of the recording medium or the two-beam interference-type hologram having different optical axes.

The invention claimed is:

1. A search method for a recording medium having a hologram recording layer in which a plurality of holograms are recorded and an address layer in which address information is recorded, said search method comprising:
    generating a search light based upon a search condition; and
    irradiating the search light onto a hologram recorded in the hologram recording layer; and wherein
    when the search light interferes with the hologram and a reproduction light is generated, address information of the hologram from which the reproduction light is generated is identified using an address light that reads the address information and the identified address information is recorded, and when the search light does not generate the reproduction light from the hologram, the search light is irradiated onto another hologram recorded in the hologram recording layer.

2. The search method according to claim 1, wherein even after the identified address information is recorded, the search light is irradiated onto another hologram recorded in the hologram recording layer.

3. The search method according to claim 1 wherein an intensity of the generated reproduction light is detected, and the detected intensity of the reproduction light is recorded in association with the address information of the hologram from which the reproduction light is generated.

4. The search method according to claim 3, wherein:
    address information with the highest reproduction light intensity is outputted in a recognizable state.

5. The search method according to claim 3, wherein:
    pieces of address information are outputted in a recognizable state in order, from the address information with the highest reproduction light intensity.

6. The search method according to claim 1, wherein:
    information related to the hologram from which the reproduction light is generated is recorded in the recording medium.

7. The search method according to claim 6, wherein an order in which the search light is irradiated onto the holograms is controlled using the information related to the hologram from which the reproduction light is generated that is recorded in the recording medium.

8. The search method according to claim 1, wherein:
    the hologram is interference fringes formed by interference between an information light carrying information and a recording reference light;
    the recording reference light is spatially modulated by a spatial modulation pattern including keyword information related to the information carried by the information light; and
    the search light is spatially modulated by a spatial modulation pattern including keyword information of the search condition.

9. The search method according to claim 1, wherein:
    the program is interference fringes formed by interference between an information light carrying image information and a recording reference light; and
    the search method is spatially modulated by the image information of the search condition.

* * * * *